(12) United States Patent
Posselt

(10) Patent No.: US 8,096,675 B1
(45) Date of Patent: Jan. 17, 2012

(54) PERFORMANCE AND COLOR CONSISTENT LED

(75) Inventor: Jason L. Posselt, Sunnyvale, CA (US)

(73) Assignee: Bridgelux Inc., Sunnyvale, CA (US)

( * ) Notice: Subject to any disclaimer, the term of this patent is extended or adjusted under 35 U.S.C. 154(b) by 613 days.

(21) Appl. No.: 12/343,080

(22) Filed: Dec. 23, 2008

(51) Int. Cl.
*F21V 33/00* (2006.01)

(52) U.S. Cl. .......................................... 362/230; 362/800

(58) Field of Classification Search ................... 362/230, 362/231, 800

See application file for complete search history.

(56) References Cited

U.S. PATENT DOCUMENTS

| 6,369,506 B1* | 4/2002 | Hata .............................. 313/499 |
| 2007/0206164 A1* | 9/2007 | Beeson et al. ................... 353/94 |
| 2008/0304261 A1* | 12/2008 | Van De Ven et al. ......... 362/231 |

* cited by examiner

*Primary Examiner* — Laura Tso
(74) *Attorney, Agent, or Firm* — Fernandez & Associates, LLP

(57) ABSTRACT

The instant invention discloses a device and method to mix and match LED die at a LED emitter or array level in an array to obtain a consistent average weighted wavelength, and/or desired flux, reducing the spread of a color range and therefore reducing the observed LED color range. The mixing of different wavelength and flux LED's expands the color gamut of the LEDs available to be used in a particular luminaire with a given color specification.

25 Claims, 11 Drawing Sheets

LED die of similar type indicated with identical cross hatching.

Figure 7 LED die of similar type indicated with identical cross hatching.

LED die area reduced over those in Fig. 7.

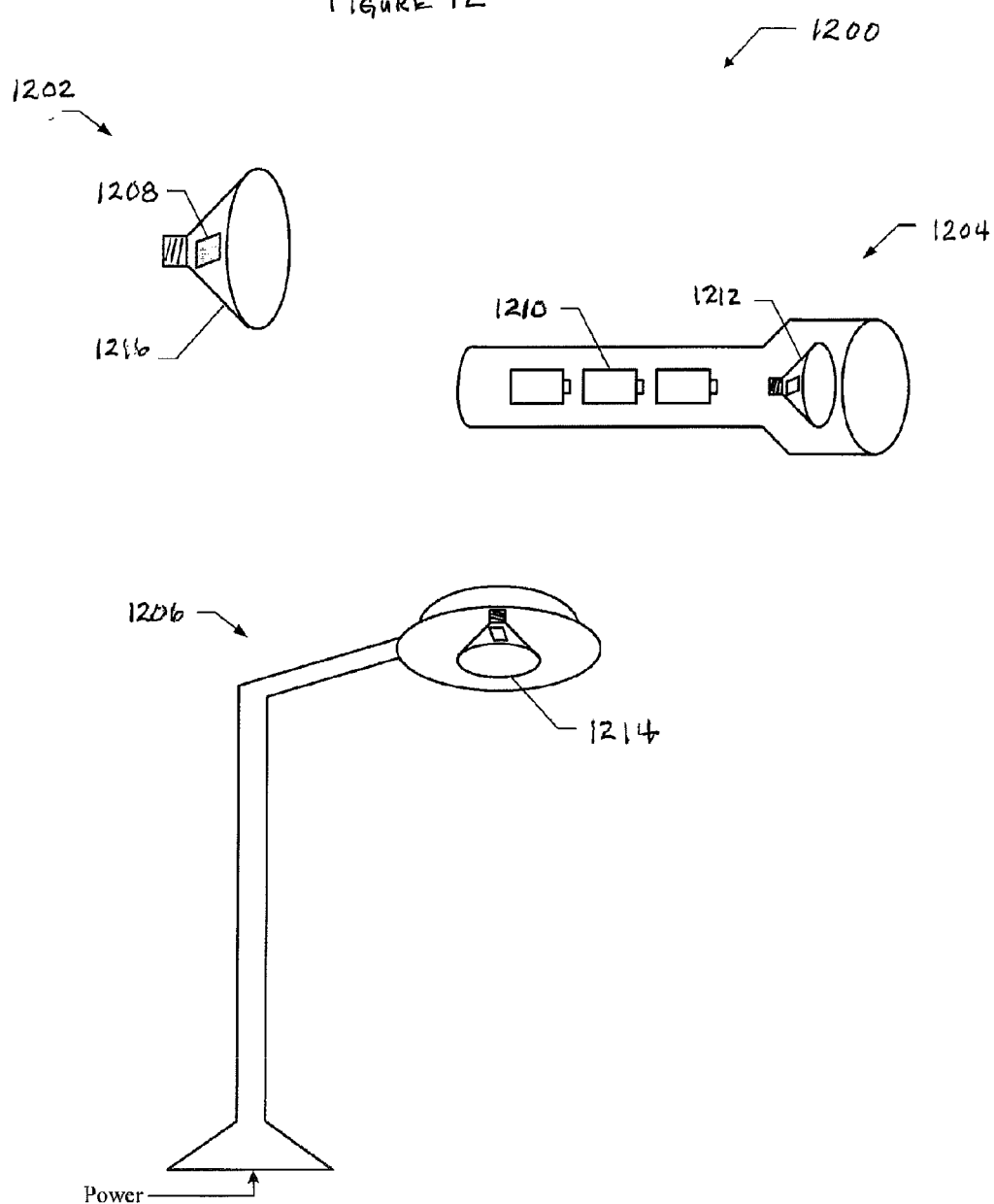

PERFORMANCE AND COLOR CONSISTENT LED

CROSS-REFERENCE TO RELATED DOCUMENTS

The present invention references U.S. Pat. No. 6,936,857, U.S.2007/0273290, U.S.2007/0081336; "The Human-Computer Interaction Handbook", ed. Andrew Sears, $2^{nd}$ Edition, 2007, CRC Press; "xvYCC"; [http://en.wikipedia.org/wiki/XvYCC], (Dec. 1, 2008); and "Munsell color system"; [http://en.wikipedia.org/wiki/Munsell], (Dec. 1, 2008) and includes them herein in their entirety by reference.

BACKGROUND OF INVENTION

Field of the Invention

This invention relates to a device and method for controlling the performance and color consistency of a light emitting product such as a LED array or a luminaire comprising a LED array.

There are different versions of the same color; for instance with "whites", there are "warm whites" and "cold whites" being a common reference and "warm" versions of other colors as well. Scientifically, all chromaticies corresponding to black body spectra making up the Planckian locus are "whites". A color near to this locus, a "white" is characterized by a deviation from the coordinates lying on the Planckian locus on the CIE chromaticity diagram and is perceived as a slight coloration called a tint. In standards like the automobile industries SAE J578, the maximum tint permitting the designation "white" is specified.

Each specific LED and/or LED/phosphor combination produces a slightly different "color" emission; that is each LED semiconductor chip, or die, has a unique emission spectra based upon composition, age, operating voltage, etc. A particular phosphor converted LED emission can be plotted as x and y coordinates on a CIE chromaticity diagram; only colors on the line connecting the two points between the color point of the blue LED die and the color point of the phosphor can be produced by the LED or LED/phosphor combination. Thus, such a combination will be limited to producing only a single color on the Planckian or other color points with a degree of tint or hue. With reference to FIG. 1, a standard CIE (Commission International de l'Eclairage) chromaticity diagram is shown mapping out the human color perception in terms of two CIE parameters x and y. For a technical description of the CIE chromaticity diagram, see, for example, "Encyclopedia of Physical Science and Technology", vol. 7, 230-231 (Robert A Meyers ed., 1987) and reference is made to [http://en.wikipedia.org/wiki/CIE_1931_color_space]; Nov. 2, 2008. The spectral colors are distributed around the edge of the outlined space, which includes all of the hues perceived by the human eye. The boundary line represents maximum saturation for the spectral colors.

In FIG. 2, approximate colors are labeled in the diagram, with the corresponding emission wavelength. The diagram represents all of the chromaticities visible to the average person. These are color labeled and this region is called the gamut of human vision. The gamut of all visible chromaticities on the CIE plot is the tongue-shaped or horseshoe-shaped figure shown in FIG. 2. The curved edge of the gamut is called the spectral locus and corresponds to monochromatic light, with wavelengths listed in nanometers. The straight edge on the lower part of the gamut is called the line of purples, 210. These colors, although they are on the border of the gamut, have no counterpart in monochromatic light. Less saturated colors appear in the interior of the figure with white at the center. It is seen that all visible chromaticities correspond to non-negative values of x, y, and z Two light sources, made up of different mixtures of various wavelengths, may appear to be the same color; this effect is called metamerism. Two light sources have the same apparent color to an observer when they have the same tristimulus values, no matter what spectral distributions of light were used to produce them. Due to the nature of the distribution of cones in the eye, the tristimulus values depend on the observer's field of view.

Since the human eye has three types of color sensors that respond to different ranges of wavelengths, a full plot of all visible colors is a three-dimensional figure. However, the concept of color can be divided into two parts: brightness and chromaticity. For example, the color white is a bright color, while the color grey is considered to be a less bright version of that same white. In other words, the chromaticity of white and grey are the same while their brightness differs.

The CIE XYZ color space was deliberately designed so that the Y parameter was a measure of the brightness or luminance of a color. The chromaticity of a color was then specified by the two derived parameters x and y, two of the three normalized values which are functions of all three tristimulus values X, Y, and Z. If one chooses any two points on the chromaticity diagram, then all colors that can be formed by mixing these two colors lie between those two points, on a straight line connecting them. It follows that the gamut of colors must be convex in shape. All colors that can be formed by mixing three sources are found inside the triangle formed by the source points on the chromaticity diagram (and so on for multiple sources); note triangles 320 and 330 in FIG. 3. An equal mixture of two equally bright colors will not generally lie on the midpoint of that line segment.

It is a well known fact that the technology for solid state lighting continues to improve rapidly. Performance increases of 20-50% per year are common as the technology continues to evolve. Just over the past few years 1-Watt white LEDs have improved from producing on the order of 30 lumens to well over 100 lumens, and this trend continues for the foreseeable future.

The pace of improvements causes challenges to the system designer using LEDs. In the design of a lighting system comprising one or more luminaires or LED based lighting fixtures, typically the designer selects an LED package, or emitter, to be used for the application, and then depending on the total lumens needed in the system determines how many LEDs are needed for a light fixture. The design is then relatively fixed, lacking in flexibility, as the optics are tooled to match a particular array of LEDs, the power source is set to deliver appropriate current to the LED array, and the fixture is designed to properly dissipate the thermal load generated by the light source.

As product life cycles for such luminaires outlive the life-cycle of LED performance, or given that LEDs get brighter and brighter while a given luminare is still in production, supply problems can occur. For some applications the increase in light from "standard" LEDs is a welcome improvement, increasing the performance of a lamp which may have been at the low end of acceptability as initially designed. However, for other applications, challenges can arise from increasingly brighter LEDs as a lamp may become too bright, create glare, deliver inconsistent performance when compared to other previously installed luminaires, or cause other problems.

There are alternatives for a luminaire manufacturer, such as to reduce drive current of the LEDs in a luminaire through tuning or replacing an electronic driver, but this too causes a problem as the LEDs are now being under driven and therefore the lighting system is not as cost effective as it could be with a reduced count of LEDs. Changing or tuning the driver may also cause a requirement for extensive approbation testing to meet UL and/or Energy Star requirements, among others, depending upon the nature of the design change. However the tradeoff is a system redesign, which may also require retooling of the optics, the LED array, housing, and other items, resulting in a significant cost and a visible difference between fixtures in a given installation.

Exemplary luminaires are found at http://en.wikipedia.org/wiki/Light_fixture, [Dec. 20, 2008]. For purposes of the instant invention a luminaire is taken to be a lighting fixture complete with the light source or lamp, the reflector for directing the light, an aperture (with or without a lens), the outer shell or housing for lamp alignment and protection, a ballast, if required, and connection to a power source. A wide variety of special light fixtures are created for use in the automotive industry, aerospace, marine and medicine.

Additionally, a challenge exists in the performance consistency of LEDs. Challenges lie in the fact that LEDs, when produced, do not all come out at the same performance level, either in light output or color. LEDs, as built, have a distribution of performance, spanning a range of colors (wavelengths or color corrected temperatures, CCT), light output (intensity or luminous flux), and forward voltage/efficacy (Vf or lumens per Watt). An LED is typically tested and then sorted into a "bin" based on color, lumen output and forward voltage. Packaged LED chips, also referred to as emitters, either singly and/or in arrays, are sold either directly to a luminaire manufacturer or to a system integrator who builds lighting fixtures or systems.

Some LED manufacturers attempt to address the flux consistency issue by offering plateau products, in other words as the product performance increases a product is launched with a parallel trajectory of performance but starting from a lower power level. The problem with this is that the plateau product, which is usually developed by placing a smaller die in the same product, may not offer enough granularity—it offers a digital jump, not an analog variation scale; a plateau product may require requalification; a plateau product may not work with the existing optics of the luminaire due to reduced die size, near field radiation pattern, or far field radiation pattern; a plateau product may behave different thermally, requiring a change to the thermal management system, heat sink or housing of the luminaire; a plateau product may have different electrical input requirements, requiring a change to the electronic driver. Therefore, while similar in package footprint, a plateau product solution may not solve the problem of the luminaire manufacturer.

For most applications it is impossible for a purchaser of LEDs to specify a very tight specification on performance due to cost considerations; typically a range of flux bins is used or a minimum flux bin is all that is guaranteed. While this can be managed by the system integrator or luminaire manufacturer, it can be complicated and non trivial, resulting in slow moving inventory and higher production costs through forcing a purchaser to solve this LED technology related problem in the luminaire.

Multiple primary color LEDs are often used for color tunable or tunable white lighting applications. Typically the emission of multiple LEDs, optionally, Red/Green/Blue/Amber/White, noted as RGB, RGBA, RGBAW, cool white/warm white, etc., is used for such applications. An array of multiple LEDs, either as emitters or as unpackaged LEDs, is clustered together and light is either mixed in the fixture, known as in-source mixing, or mixed on an illuminated object surface, known as mix-on-target. Lamps using multiple LEDs combined into one source are common in the industry.

Challenges lie in the fact that LEDs, when manufactured, come out in a distribution of colors or wavelengths; sometimes as broad as 20 or 30 nm about a given center wavelength. Typically LEDs, as built, have a normal distribution, spanning a color range, wavelength, $\lambda_o \pm 15$ nm, light output, flux, $\Phi_o \pm 30\%$ in lumens, and power consumption ($V_f$); where $\lambda_o$ and $\Phi_o$ represent the midpoint of a distribution; we are not concerned with $V_f$ in this application; however similar matching techniques may be applied to it as well.

For most applications it is impossible for the user of the LEDs to specify a tight specification on flux and color; typically a range of a color is used. Intelligent mixing can be achieved to minimize overall luminary color variation, but in doing so the available color gamut is limited when it is critical for all versions of the fixture to be capable of producing the same colors. Producing the "same" color in multiple fixtures is critical; it is critical both in the instance of fixed or permanent installations, such as a long wall requiring multiple luminaires to illuminate, as well as for mobile or temporary installations. Many color tunable lighting fixtures are sold into the rental entertainment market. For instance, a concert tour requires the "same" colors from multiple versions of a lighting system from different production runs and locations. Therefore color consistency is critical.

The color gamut problem has not been adequately addressed. In some cases the flux output improvement issue is managed by the luminare manufacturer through reducing the drive current of the LEDs in the fixture, but this results in a less cost optimized solution compared to competitors—the user is still purchasing the same number of packages, a user is just not driving them at the level for which he is paying; challenges in driver redesign—can require requalification, running part number changes, new part numbers, product lifecycle management; spare parts and service parts issues—if some luminaires are built with a different combination of boards and drivers than others it can be complicated to offer service parts or repair damaged luminaires; inconsistency in luminaire performance—if not adjusted quickly due to performance increases a case where an installation of multiple luminaries which do not appear consistent can result, suggesting poor quality of the luminaire.

There are limited ways to address this issue today given current technology. Most users of this technology are forced to live with a reduced color gamut due to the requirement to "drop to the lowest common denominator." There are a few cases where companies have looked to solve this problem at the system level through binning the LEDs they purchase, but this is a very complex process which has several disadvantages. It is feasible to intelligently mix LED packages or emitters to create a consistent color output from the luminaire using complex mathematical binning algorithms. Through mixing and matching LED emitters at the system level a consistent average weighted wavelength can be achieved which will reduce the spread of the color range and therefore reduce the muddying of the LED colors, expanding the color gamut. However, such a process often mixes on target rather than in the fixture, when not done at the pixel level; requires a customer to carry a relatively large inventory of product to enable the right "mixing" of LEDs; can result in problems for the customer if the distribution of product received shifts from one end of the specification to the other, leaving them in a high inventory position without the ability to build any product; can easily result in "tails of the distribution" or products which are harder to mix in the fixture, resulting in slow moving inventory or scrap, increasing the product cost To date this problem is not addressed by the LED supplier; it is managed by the integrator or luminaire manufacturer at the system level rather than at the component level. The instant invention addresses the issue at the component level, guaranteeing a color consistent LED or pixel every time to the system integrator or luminaire manufacturer. This will have the following advantages, eliminate the need for binning; reduce the cost of the product—no special selections required; increase the die utilization for the LED manufacturer, resolving challenges on the front end for supporting custom selections, and reduce pricing; deliver consistency in every product from every production run; allow for an increase in available color gamut from the end fixture or luminaire.

It should be noted that the non-LED lighting community is accustomed to receiving consistent sources. A 60 W incandescent lamp delivers the same number of lumens year after year. The same is true for other conventional lighting sources. The LED lighting community has been forced to deviate from these norms with LEDs, where the technology to date has struggled to deliver consistent performance.

BRIEF DESCRIPTION OF THE INVENTION

The instant invention discloses a solution to both the consistency problem and in delivering the quantity of light required to match conventional lighting sources. The instant invention discloses a common LED source size and footprint which does not change over time. The light output target is set at a value of conventional light sources, and held constant across production runs and over time. For example, when the performance delivered is 800 lumens, either at temperature or at another specified condition, this invention reduces the spread of performance and delivers a product which consistently delivers, for instance, 800 lm with the same or similar $I_f$ and $V_f$ to eliminate the need for tuning; consistently delivers 800 lumens over time, even as the LED performance continues to increase, in the same source size compatible with the same optics and in the same package footprint; enables opportunities for cost reduction as the LED technology continues to increase through optimizing and minimizing the semiconductor content in the package over time; in effect allows the LED lifecycle to outlive the lifecycle of a particular luminare, simplifying the management of a product lifecycle for the luminare manufacturer. There may be cases where instead of requiring the same If and Vf a similar enough power level is required to use the same driver. For example, a new array may be driven with the same If but have a lower Vf due to the removal of a series device. This array will likely work with the same driver, just draw a lower Vf. Most drivers can accommodate a range of output Vf.

The instant invention discloses a device and method to mix and match LED emitters and/or die in an LED emitter or array to obtain a consistent average weighted wavelength, and/or desired flux, reducing the spread of a color range and therefore reducing the observed LED color range. The mixing of different wavelength and flux LED's expands the color gamut of the LEDs available to be used in a particular luminaire within a given color specification and enables color consistency luminaire to luminaire or color pixel to color pixel within a multi-pixel luminaire.

BRIEF DESCRIPTION OF THE DRAWINGS

FIG. 12 shows exemplary luminaires comprising an LED array.

DETAILED DESCRIPTION OF THE INVENTION

The present invention focuses on resolving the performance consistency and stability problem within an LED based light source. The invention comprises a multichip LED package or array in which multiple die are placed closely together to facilitate light mixing within a package. In some embodiments white light is produced via a phosphor conversion of a portion of blue light to yellow light with one or more phosphor compounds, mixing together to create white light. LED die used in a LED package are typically first individually tested and binned. Using binning information, an algorithm is used to determine an appropriate procedure to populate a LED array to achieve a desired product with selected wavelength, range, intensity and flux range.

Figure 1:
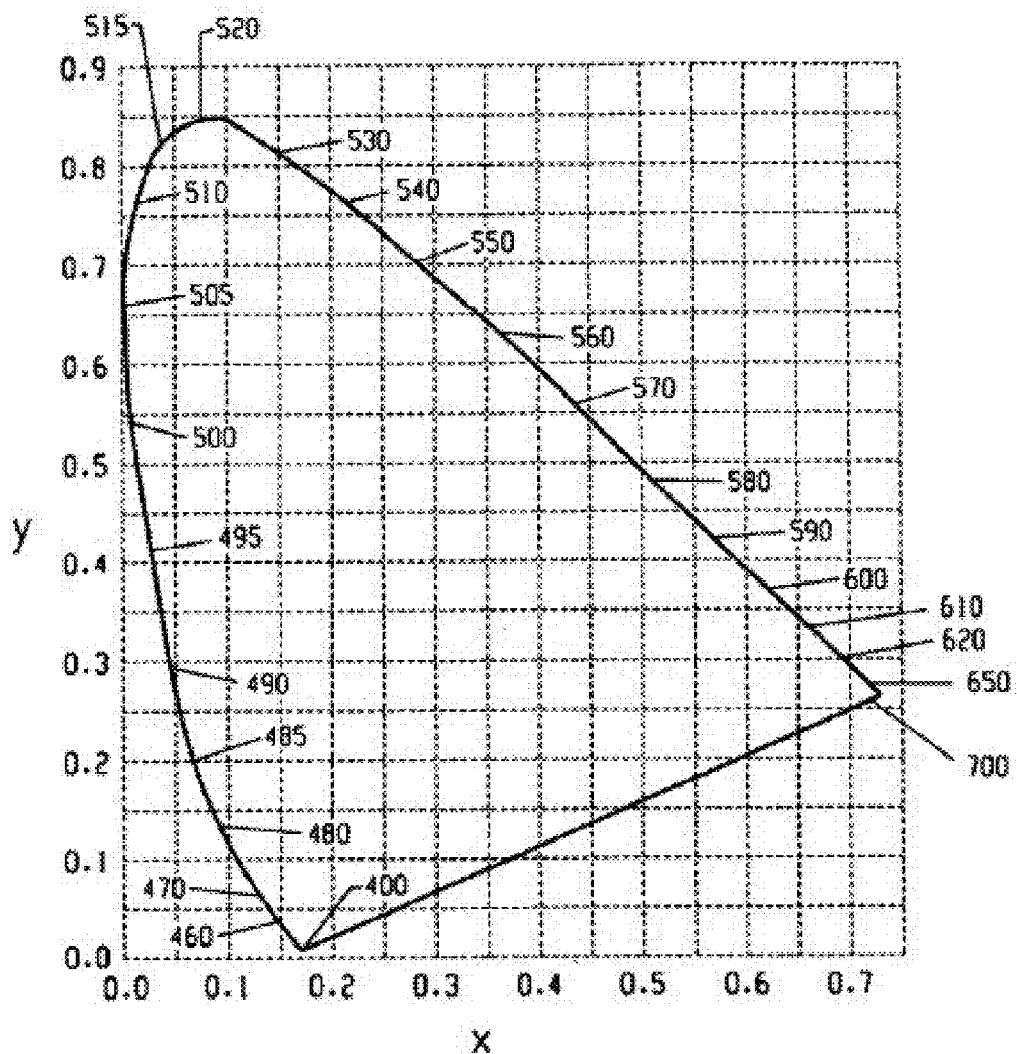
FIG. 1 is a schematic a standard CIE 1931 chromaticity diagram.
Figure 2:
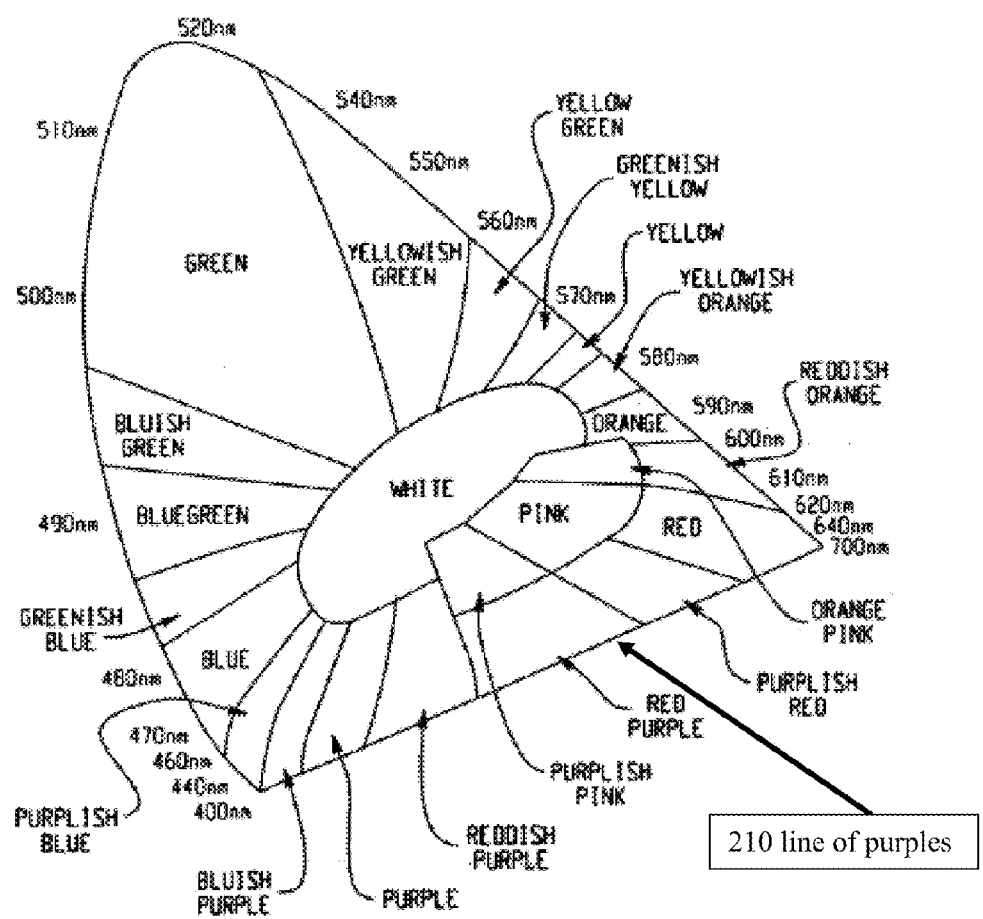
FIG. 2 is a schematic a chromaticity diagram with color regions mapped.
Figure 3:
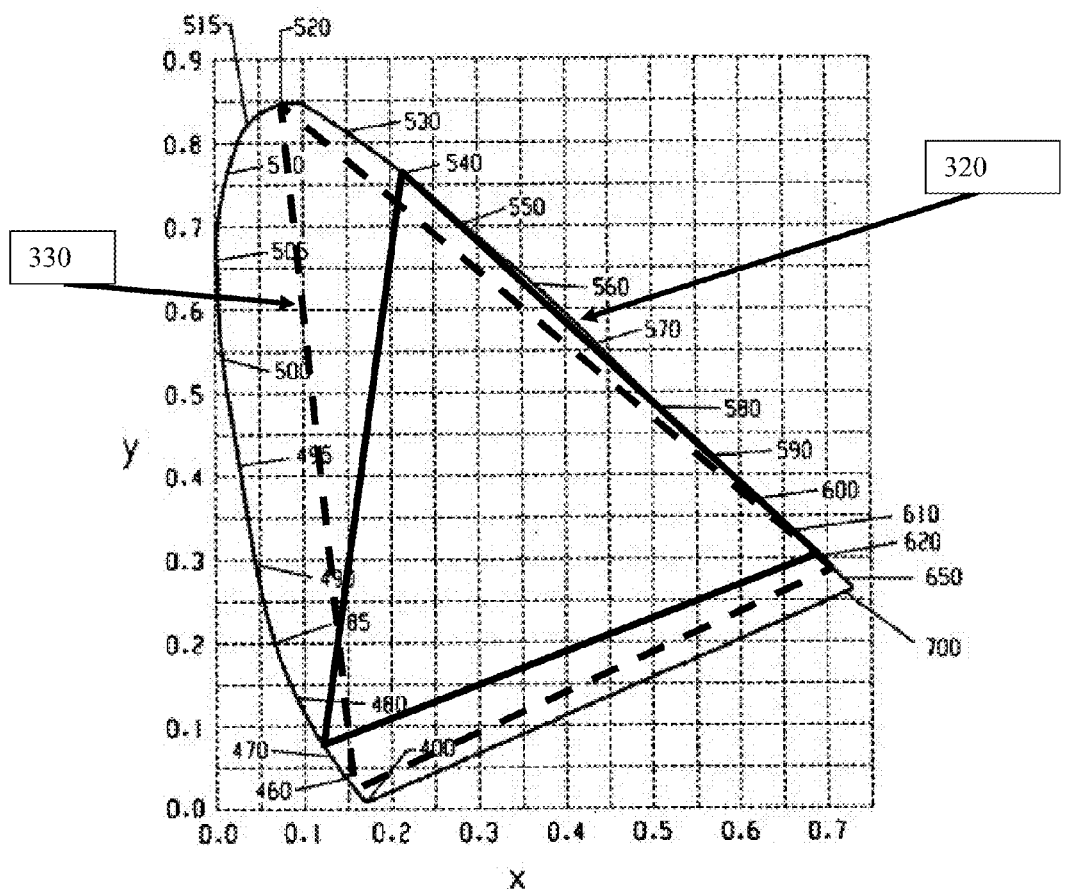
FIG. 3 is a depiction of two separate triangles of available color space.

FIG. 3 shows two separate triangles, 320 and 330, of available color space which may be generated from an RGB array solution with different wavelengths for red, green and blue LEDs; shown are 520 nm Green, 450 nm Blue, 630 nm Red (330) and 540 nm Green, 475 nm Blue and 620 nm Red (320); representative of a typical LED production distribution.

Figure 4:
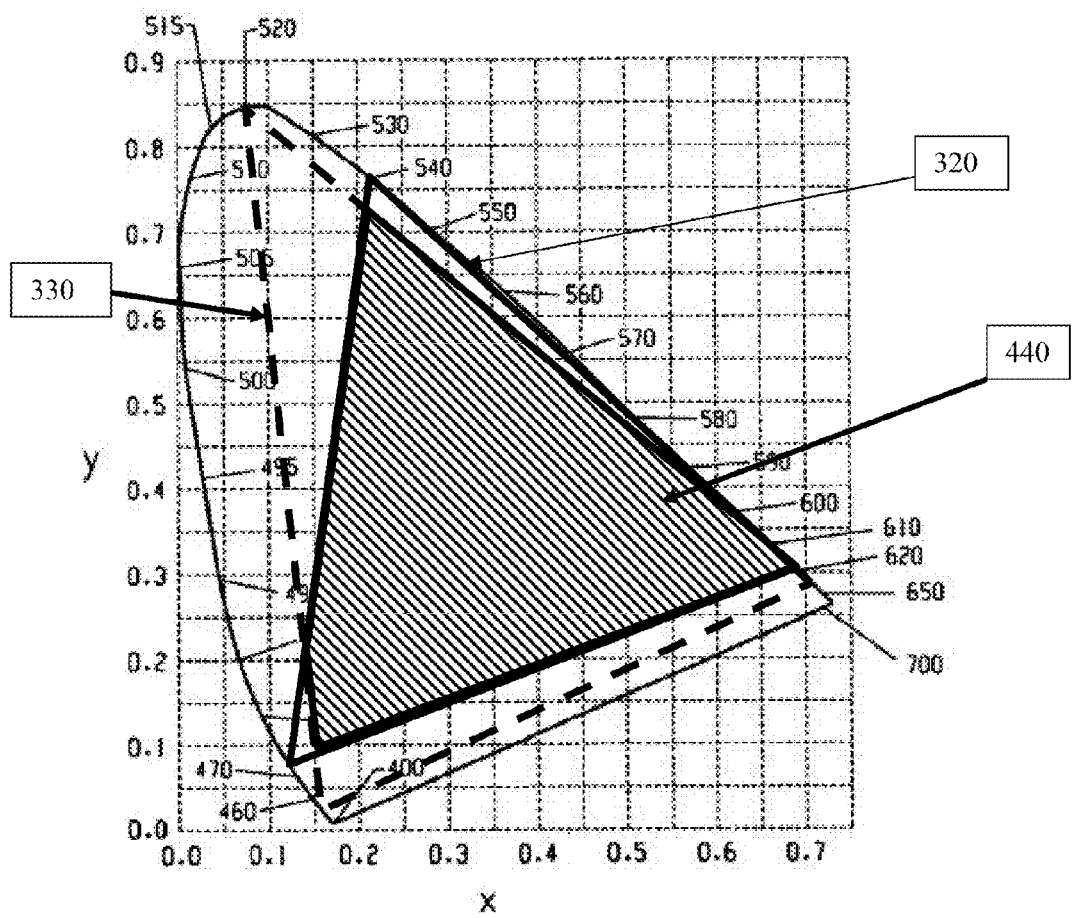
FIG. 4 shows a limited color gamut which can be achieved system to system without intelligent mixing

FIG. 4 shows a limited color gamut, 440, produced when some pixels are created from each of the two triangles shown in the first figure; 440 is the intersection of 320 and 330. When it is critical to have a reproducible color gamut from fixture to fixture, the color gamut must be reduced to the lowest common denominator reproducible by all pixels or luminaires, significantly limiting the available color gamut and the range of colors available to a designer.

Figure 5:
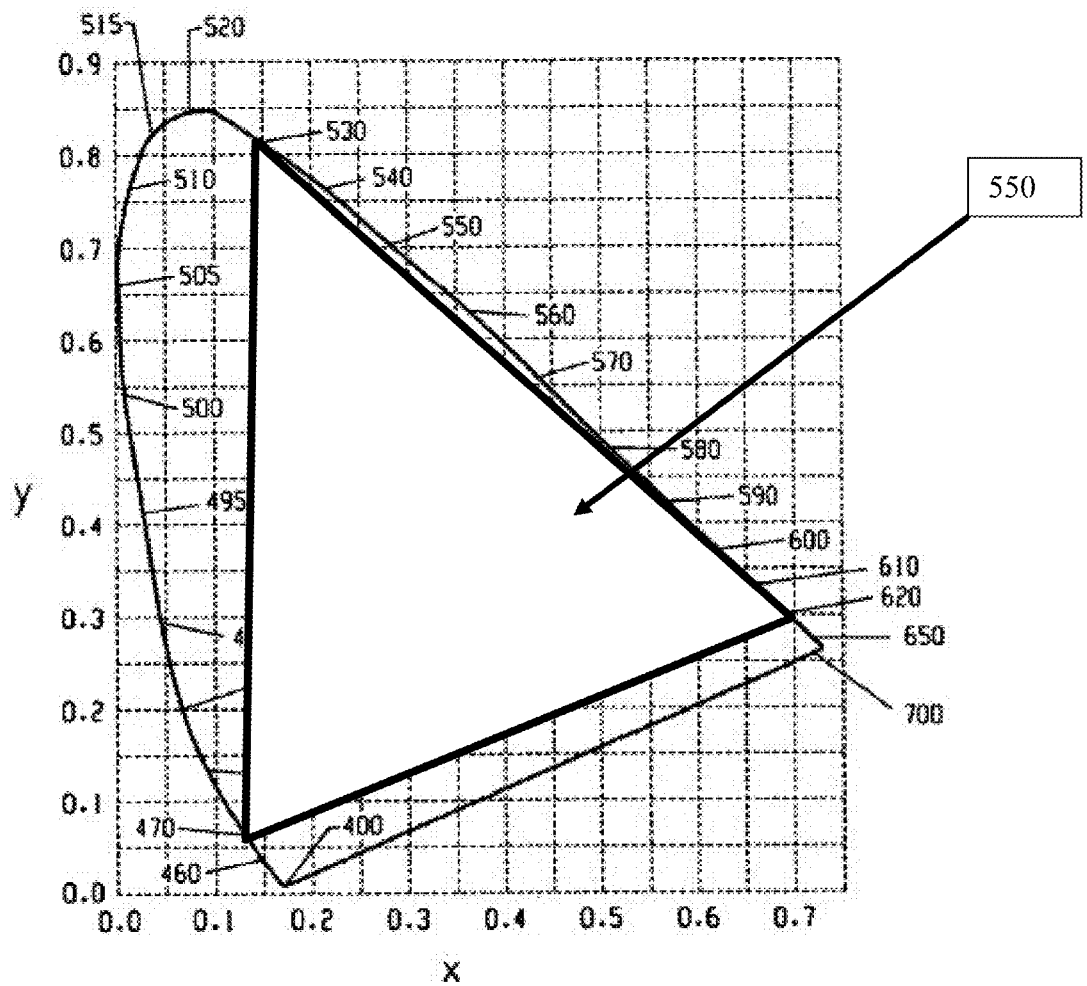
FIG. 5 is a color gamut achievable from an RGB array with discrete primary color points.

FIG. 5 is a color gamut, 550, achievable from an RGB array with discrete values for Red, Green and Blue color points managed through intelligent mixing of multiple sources of varying wavelength and intensity.

Figure 6:
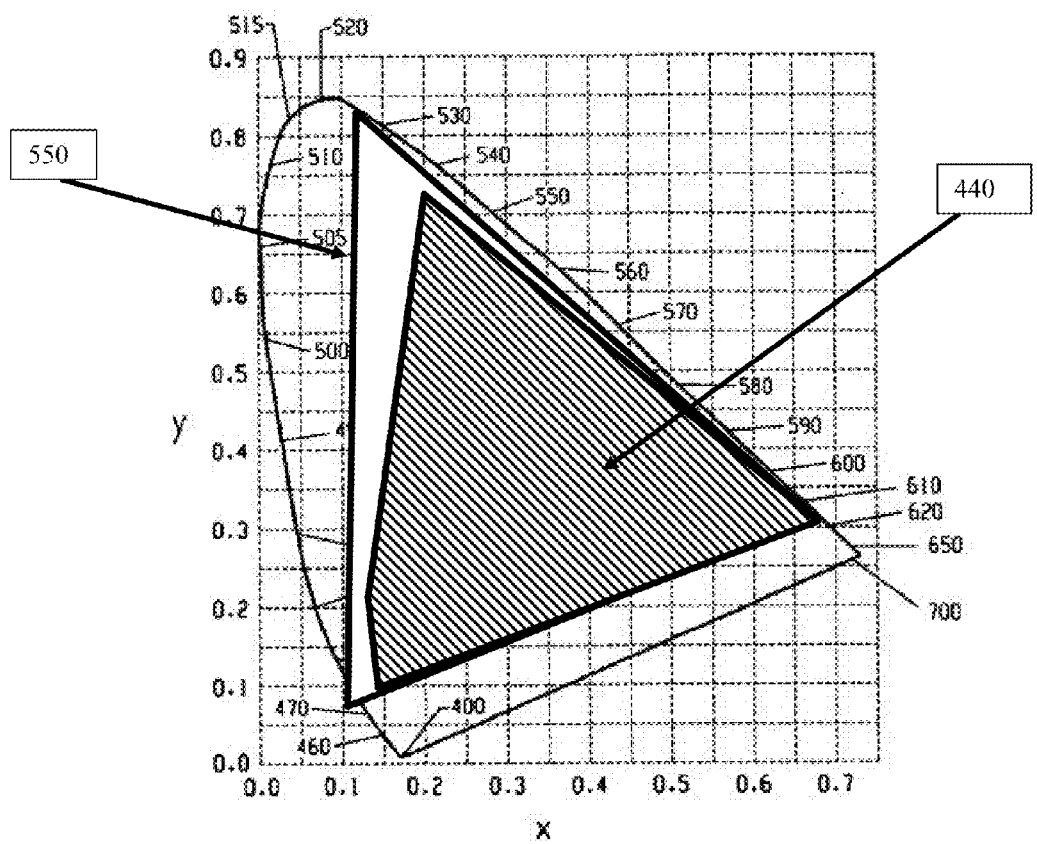
FIG. 6 is an illustration of expansion of the available color gamut from an intelligently mixed RGB pixel.

FIG. 6 is a comparison of expansion of the available color gamut from an intelligently mixed RGB pixel, 550, compared to the lowest common denomenator approach, 440, significantly improving the available color space which can be reproduced from fixture to fixture.

Figure 7:
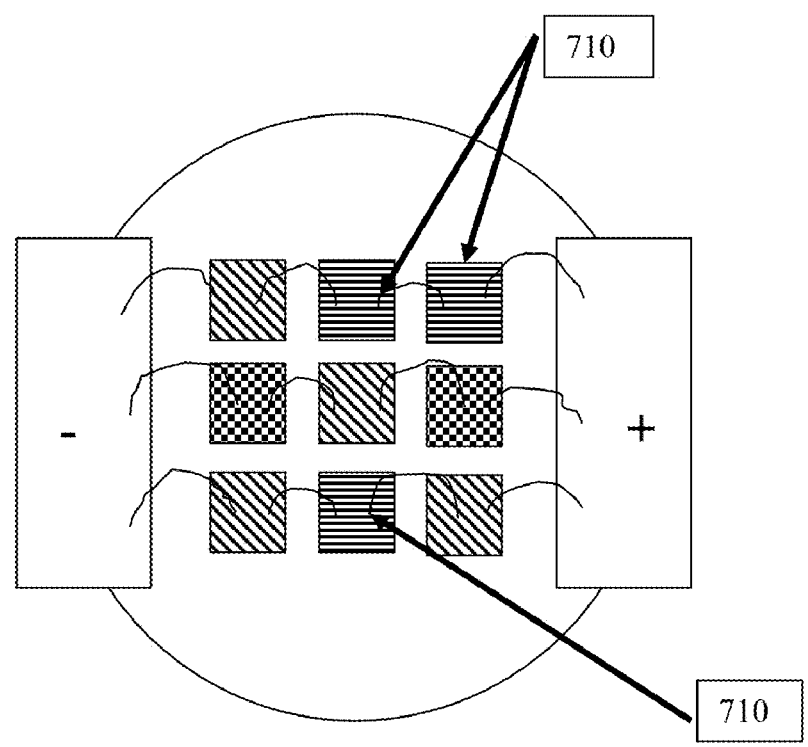
FIG. 7 is an exemplary LED array.
Figure 9:
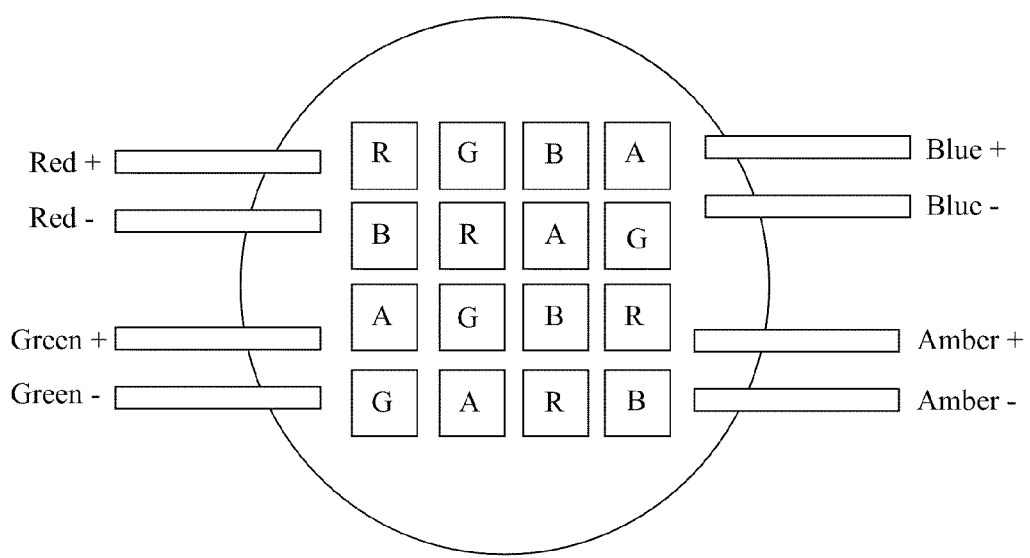
FIG. 9 is an exemplary LED array.
Figure 10:
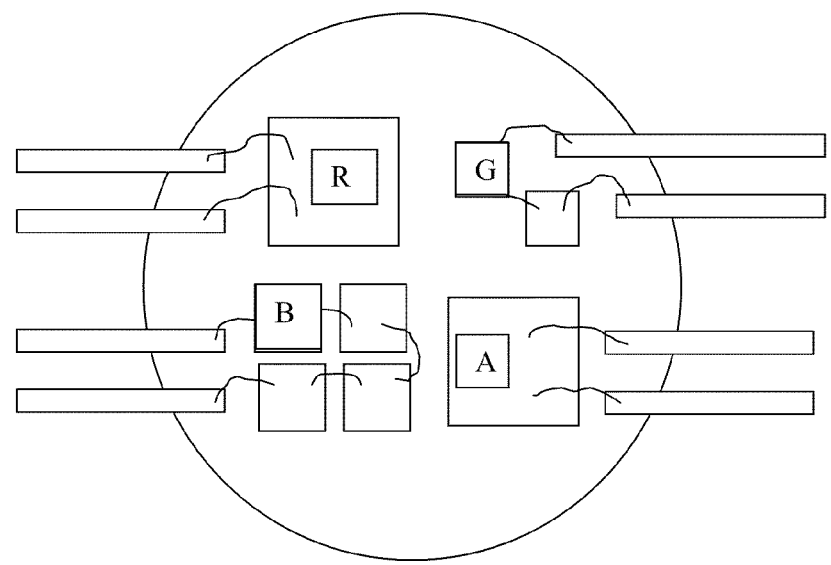
FIG. 10 is an exemplary LED array with different size die.

FIG. 7 illustrates one embodiment of the instant invention; mixing die of various performance within one LED array in order to minimize distribution of color or flux through intelligent mixing; die of similar color and/or flux performance are indicated with identical cross hatching; for instance 710 may be die emitting a green color, $\lambda_o$=530 nm±10 nm, and/or die outputting a Φ of 70 L±20 L. Note that the LED die are in three color strings, connected in parallel and in series within a string, with the colors mixed in a string. An LED color string comprises one or more LED die; optionally, the die are of the same color or not; optionally, the die are of similar flux or not; the die may be as emitters or not; a color string may be part of a LED array; optionally, the die in a color string are connected in series electrically and mounted on a common substrate or package as shown in FIGS. 7, 8, 9 and 10. In some embodiments a color string comprises die of about the same color; in some embodiments a device with multiple color strings may modulate each string independently of other strings with regard to applied voltage or current, and/or duty cycle; FIGS. 9 and 10 are examples of an embodiment of this type.

Figure 8:
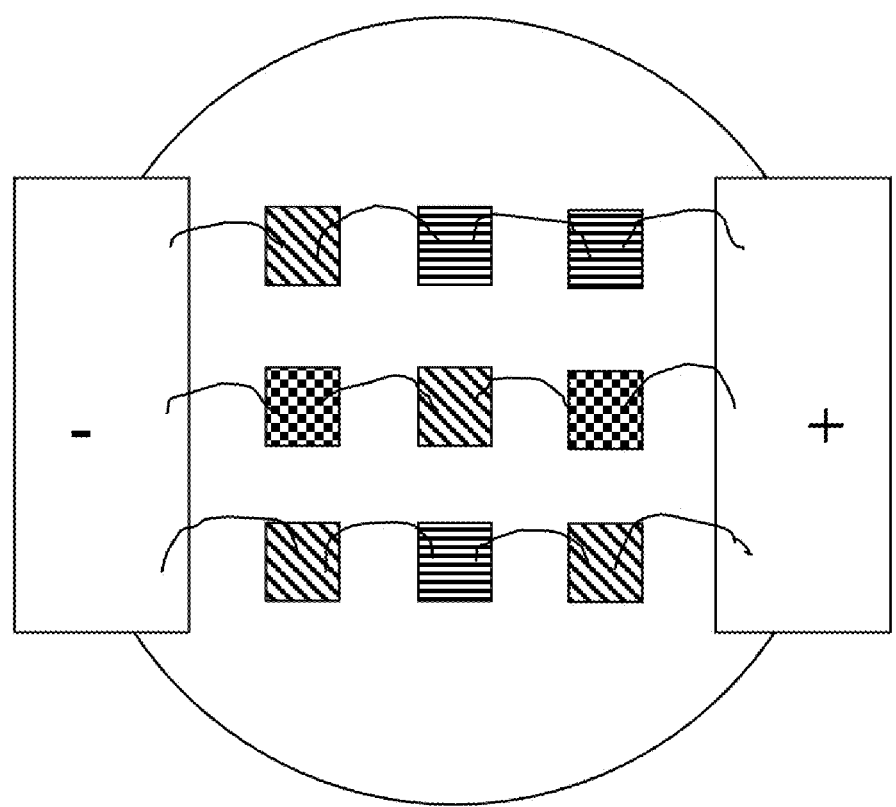
FIG. 8 is an exemplary LED array.

FIG. 8 illustrates one embodiment of the instant invention; mixing die of various performance within one array in order to minimize distribution of color or flux through intelligent mixing (die of similar performance indicated with identical cross hatching). Die size is reduced as flux output per die increases to maintain consistent light output.

FIG. 9 illustrates one embodiment of the instant invention; mixing multiple sources of multiple colors within an array with common connections for anode and cathode leads per color to improve color mixing in source and reduce variability of the emitted mixed light. By optimizing die selection, placement and die to die spacing color mixing within a package is improved, resulting in a device with predetermined flux and wavelength ranges at user selectable nominal values.

In this embodiment each color, R, G, B, and A, is wired, not shown, in series, parallel or a series/parallel array configuration separately in order that each color is individually controlled electrically. The LED die of each color contribute to a average weighted wavelength per color channel, perceived by an observer, based on the intensity and wavelength emitted by the individual die, as described in Eqn. (1).

Typically a color gamut is reduced by the need to shrink the gamut to the lowest common denominator. An RGB example of this challenge is shown in the FIG. 6. The color gamut which is guaranteed to be reproducible from multiple fixtures is much smaller than that of a fixture with a known single color point for each primary, held consistent over time. An available color gamut can be increased if a color consistent LED or pixel can be developed where a small range of values for color are held constant rather than a typical range of wavelengths per color.

In one embodiment of the invention brighter and dimmer emitters and/or die are matched together in an array using an algorithm to reduce the range of the emitted light distribution around a predetermined value. There are a multitude of available combinations which can be envisioned to deliver this color consistency. The mixing of LED chips or emitters results in a tightened performance distribution about a desired specification and increased array to array uniformity for an given manufacturing process and over time as a process "improves".

In one embodiment of the invention, consistent intensity or brightness performance is delivered through shrinking the die used but in a similar configuration within the LED package. As LED die improve in efficiency and become brighter and brighter for the same power input, it is possible to gradually reduce LED chip size to compensate for flux output improvements while maintaining the same product intensity performance. When LED chip size reduction is done in an LED emitter or array and reduction is done in such a way as to not affect the far field radiation pattern of the device, a redesign of the optics is not required for many lighting applications. The same mixing and matching of various brightness performance levels of die can be used once such a die shrink is completed, as can be seen by comparing FIGS. 7 and 8.

In one embodiment of the invention, not shown, LED die of varying sizes are mixed in an array to match a performance specification across a manufacturing flux and wavelength distribution over time as the LED performance improves. Care must be exercised in developing acceptable recipes to avoid overdriving smaller die. Mixing and matching of chip sizes may be combined with mixing and matching of various flux and wavelength performance levels, offering many options to set and adjust an array level product to a consistent performance specification.

The instant invention comprises a multichip LED package, typically in an LED array format as shown in FIGS. 7, 8 and 9. An LED array comprises an emitter array and/or unpackaged LED die wherein multiple light emitting die or chips are placed closely together to facilitate light mixing within a package. In some embodiments an LED array is configured as one or more pixels comprising one or more colors of one or more wavelength ranges. Typical versions of this product include RGB, RGBA, RGGB, RGBW, RGBAW die, or other combinations comprising at least two primary color ranges.

For the colors desired for a pixel, one chip or multiple chip combinations are used to deliver a consistent, predetermined wavelength span per primary color desired. These multiple die are connected in series, or parallel, or in series/parallel arrangements. The die can be connected either using wire bonds or via traces on a substrate or flip chip or other packaging techniques known.

In one embodiment of the invention LED blue and green die are matched for color and flux in a pixel to deliver a consistent, predetermined wavelength from a package comprising an emitter or die array. In some embodiments an LED array uses multiple small die rather than one or two large die to enable the narrowing of the delivered distribution; An "average weighted wavelength" for an LED array is achieved by the judicious combination of die of shorter and longer wavelength around a nominal value. A multitude of available die combinations can be envisioned to deliver color and intensity consistency.

In one embodiment in FIG. 10 green and blue die are mixed to narrow the distribution, but for the red and amber die single larger die are shown. The invention considers the fact that the AlInGaP technology used to build the red and amber die is much more mature than that of the InGaN technology used to create blue and green therefore potentially enabling a tight enough selection of red and amber die at the die level for this pixel, eliminating the need for mixing of these colors. However, other embodiments include a mixing of die for AlInGaP colors as well.

One embodiment of the invention comprises an LED array with an increased amount of green content and a reduced amount of blue content. The design delivers the appropriate lumen contributions to enable white light which is primarily composed of green with a very small amount of blue. It is feasible with the invention to tune the proportions of color desired for the application via appropriately sizing and color matching die used in the construction, therefore delivering a source tailored to an application and minimizing semiconductor content and cost.

The matching of various LED die with wavelengths and intensities higher and lower than the predetermined wavelength specification are matched according to the following algorithm:

$$[\Phi_1\lambda_1+\phi_2\lambda_2+\Phi_3\lambda_3+\ldots\Phi_n\lambda_n]\div[\Sigma_{1-n}\Phi_i]=<\lambda_{aww}> \qquad (1)$$

where $\Phi_i$ is the flux of a die emitting at $\lambda_1$.

$<\lambda_{aww}>$ is defined herein as the "average weighted wavelength"; an observer perceives the average weighted wavelength as the color of the array at the combined intensity of the various die in the string when the LED die are placed in close proximity in a LED array. Typically close proximity is taken to be a separation less than about 3.0 mm for 1 mm die. The combined emitted wavelengths and intensities of each color string within an array determine where an observer perceives the device on a CIE chromaticity diagram. The instant invention discloses a device and method for reliably reproducing predetermined average weighted wavelengths within a narrow intensity range emitted from a LED array comprising at least two LED die and one or more color strings.

In embodiments comprising at least two LED die and one or more color strings the disclosed method enables manufacture of a color string with very narrow specifications for color, or wavelength range, and intensity or flux range across a broad manufacturing process distribution; for instance, a specification on average weighted wavelength color may be less than about 50% of a typical bin width and flux less than 2.5% of a nominal flux target; in an embodiment the instant invention enables an average weighted wavelength range of about ±1 nm about a nominal wavelength target, for example, 457.5 to 459.5 nm and ±2.5% about a nominal flux target, for example, 68.25 to 71.75 μm.

For purposes of the instant invention Table 1 presents exemplary ranges for various LED emitted colors and intensities and exemplary bin widths.

TABLE 1

LED, 1 watt, about 1 mm² die

| Color | λ, range, nm | Flux range, lm | bin range, nm |
|---|---|---|---|
| Blue | 440-475 | 10-40 | 2.5 to 5 |
| Green | 520-540 | 40-100 | 5 |
| Amber | 584-592 | 20-50 | 2 |
| Red | 610-640 | 35-80 | 5 |

Wavelength ranges, fluxes and bins may vary among various manufacturers; Table 1 represents typical values for the industry.

For calculating a combined flux of several LEDs the following is appropriate:

$$\Phi_w = k_p[\Phi_1 + \Phi_2 + \Phi_3 + \ldots \Phi_n] \quad (2)$$

where $\Phi_w$ is the overall flux perceived by an observer, in lumens, of the various LED die; when a phosphor is used, $k_p$, takes on an value appropriate for the phosphor and the die; otherwise it is 1.

Figure 11:
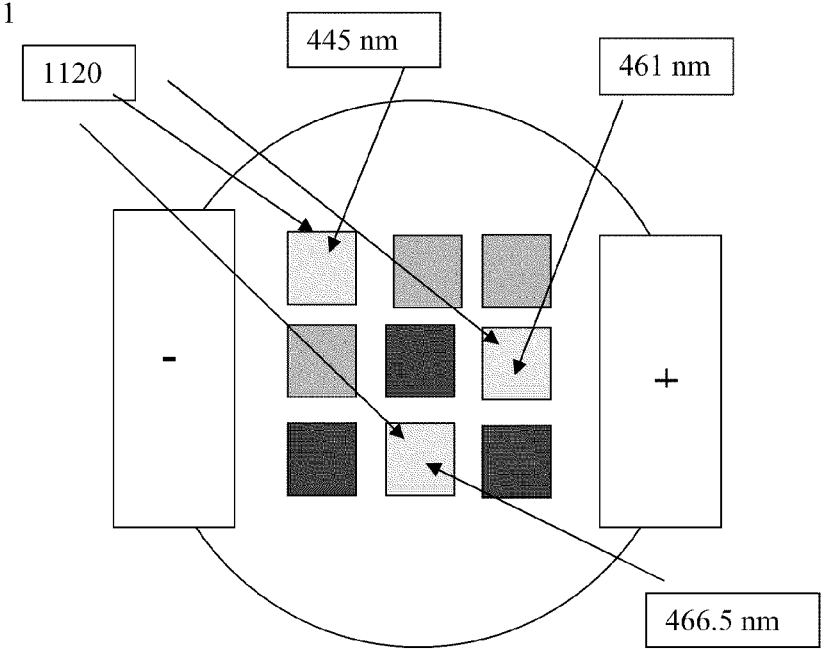
FIG. 11 is an exemplary LED color string with die of different wavelengths.

FIG. 11 schematically shows one embodiment; a LED array comprising a first color string, 1120, comprising at least two LED die emitting about a first selected wavelength and first selected range, optionally 457.5 nm, wherein the at least two die comprise one die emitting at a wavelength, optionally 445 nm, shorter than the first selected wavelength minus the first selected range and one die emitting at a wavelength, optionally 461 nm, longer than the first selected wavelength plus the first selected range, and in this case a third die emitting at 466.5 nm, such that the first color string has an average weighted wavelength within the first selected range of the first selected wavelength and the first selected range is less than about ±2.5 nm; in this example the first selected wavelength is about 457.5 nm. Note in this example all die are assumed to have the same flux; a range is given as an absolute number such as 2.5 nm and is taken to be "±" about a nominal wavelength. Alternative embodiments, not shown, may comprise an LED array wherein a first color string emits about 800 lumens±10%; alternatively a first color string may emit about 800 lumens±5% and within selected wavelength, $\lambda_s$, of 457.5 with a selected range of ±2 nm; alternatively a first color string may emit about $\Phi_w$ lumens±5% and about a selected wavelength, $\lambda_s$, wherein the average weighted wavelength of the die, $\langle\lambda_{aww}\rangle$, is within ±2 nm of the selected wavelength, $\lambda_s$; $\Phi_w$, lumens, and $\lambda_s$, nm, are selected nominal flux and wavelength specifications for a product with ranges of about ±5% and ±2 nm, respectively; alternatively a flux may range between about 20 lm to about 10,000 μm in some embodiments; a wave length range may be between about 1 nm 20 nm.

Alternatively, a LED array may further comprise a second color string comprising at least two LED die emitting about a second selected wavelength and second selected range; wherein the at least two die comprise one die emitting at a wavelength shorter than the second selected wavelength, $\lambda_{s2}$, minus the second selected range, $-r_{s2}$, and one die emitting at a wavelength longer than the second selected wavelength, $\lambda_{s2}$, plus the second selected range, $+r_{s2}$, such that the second predetermined average weighted wavelength range, $r_{s2}$, is less than about ±2.5 nm; alternatively, a LED array may comprise a first color string comprising one of a red string, a green string or a blue string; alternatively, a LED array may comprise first and second color strings having a first and second flux within ±10%, optionally, a tighter specification is used, of nominal lumen specifications, $\Phi_{w1}$ and $\Phi_{w2}$ and color specifications of, $\lambda_{s1}$±$r_1$ nm and $\lambda_{s2}$±$r_2$ nm such that the average weighted wavelength of the first color string is $[\lambda_{s1}-r_1]$ <<$\lambda_{aww1}$>><$[\lambda_{s1}+r_1]$ and $[\lambda_{s2}-r_2]$<<$\lambda_{aww2}$>><$[\lambda_{s2}+r_2]$.

In some embodiments a method for selecting die for a LED array comprises the steps: selecting first wavelength and first range; and selecting at least two LED die for the first wavelength wherein the at least two die comprise one die emitting at a wavelength shorter than the first wavelength minus the first range and one die emitting at a wavelength longer than the first wavelength plus the first range such that the first range is less than about ±1.0 nm; optionally, less than about ±2.5 nm; optionally, less than about ±5.0 nm; optionally, less than about ±7.5 nm; optionally, less than about ±10 nm. As used herein, a wavelength range is assumed to be divided equally longer and shorter than a selected wavelength. Optionally, a method for selecting die for a LED array comprises the additional steps of: selecting a second wavelength and a second range; selecting at least two LED die for the second wavelength wherein the at least two die comprise one die emitting at a wavelength less than the second wavelength minus the second range and one die emitting at a wavelength longer than the second wavelength plus the second range such that the second range is less than about ±1.0 nm; optionally, less than about ±2.5 nm; optionally, less than about ±5.0 nm; optionally, less than about ±7.5 nm; optionally, less than about ±10 nm. Optionally, a method for selecting die for a LED array comprises the additional step of: selecting all of said at least two die such that said first color string emits about first nominal lumen specification, $\Phi_{w1}$, within a variation less than about ±2.5%; optionally, within a variation less than about ±5%; optionally, within a variation less than about ±10%; optionally, within a variation less than about ±15%; optionally, within a variation less than about ±20%.

In some embodiments an average weighted wavelength of a color string may correspond to nominal selected wavelengths, $\lambda_s$, and ranges as shown in Table 2. For instance, a color string may have a nominal wavelength, $\lambda_s$, of 460 nm and range, $r_i$, of ≦1 nm, spanning 459 to 461 nm; optionally, a range may be ≦2.5 nm; optionally, a range may be ≦5.0 nm; optionally, a range may be ≦7.5 nm; optionally, a range may be ≦10 nm. Customer appropriate nominal intensity and ranges for the flux of a color string are also enabled by the instant invention.

TABLE 2

| Color | nominal Wavelength | Range, $r_i$, (+/− wavelength in nm) | | | | |
|---|---|---|---|---|---|---|
| Blue | 450 | 1 | 2.5 | 5 | 7.5 | 10 |
|  | 455 | 1 | 2.5 | 5 | 7.5 | 10 |
|  | 460 | 1 | 2.5 | 5 | 7.5 | 10 |
|  | 465 | 1 | 2.5 | 5 | 7.5 | 10 |
| Green | 525 | 1 | 2.5 | 5 | 7.5 | 10 |
|  | 530 | 1 | 2.5 | 5 | 7.5 | 10 |
|  | 535 | 1 | 2.5 | 5 | 7.5 | 10 |
| Red | 620 | 1 | 2.5 | 5 | 7.5 | 10 |
|  | 625 | 1 | 2.5 | 5 | 7.5 | 10 |
|  | 630 | 1 | 2.5 | 5 | 7.5 | 10 |

FIG. 12 shows exemplary apparatus 1200 including LED devices comprising an LED array in accordance with aspects of the present invention. Apparatus 1200 include a lamp 1202, an illumination device 1204, and a street light 1206. Each device shown in FIG. 12 includes at least an LED array and color string as described herein. For example, lamp 1202 includes a package 1216 and an LED 1208, including an LED array. For example, lamp 1202 may be used in an automobile headlamp, street light, overhead light, or in any general illumination application. Illumination device 1204 includes a power source 1210 electrically coupled to lamp 1212, which may be configured as lamp 1202. In an aspect, power source 1210 is any suitable type of power source, such as a solar cell or battery. Street light 1206 includes a power source connected to a lamp 1214, which may be configured as lamp 1202. In an aspect, lamp 1214 includes an LED array. It is noted that aspects of the LED described herein are suitable for use with virtually any type of LED assembly, and are not limited to the devices shown in FIG. 12.

In some embodiments the instant invention enables one or more LED luminaire designs and products; U.S. Pat. No. 7,455,431 and U.S.2008/0297054, included herein in their entirety by reference, disclose exemplary luminaires without the benefits of the instant invention. A luminaire is disclosed comprising an LED array comprising at least one color string comprising at least two LED die emitting about a first selected wavelength within first selected range, wherein the at least two die of the at least one color string comprise one die emitting at a wavelength shorter than the first selected wavelength, $\lambda_{s1}$, minus the first selected range, $r_1$, and one die emitting at a wavelength longer than the first selected wavelength, $\lambda_{s1}$, plus the first selected range, $r_1$, such that the average weighted wavelengths of the first color string satisfy the requirement: $[\lambda_{s1}-r_1] << \lambda_{aww1} > < [\lambda_{s1}+r_1]$. Optionally, a luminaire has an average weighted wavelength, $<\lambda_{aww1}>$, chosen between about 440 and 640 nm and a selected range is chosen equal to or less than about 10 nm.

Foregoing described embodiments of the invention are provided as illustrations and descriptions. They are not intended to limit the invention to precise form described. In particular, it is contemplated that functional implementation of invention described herein may be implemented equivalently. Alternative construction techniques and processes are apparent to one knowledgeable with integrated circuit and LED technology. Other variations and embodiments are possible in light of above teachings, and it is thus intended that the scope of invention not be limited by this Detailed Description, but rather by claims following.

I claim:

1. A LED array comprising;
a first color string comprising at least two first LED die emitting about a first selected wavelength, $\lambda_{s1}$, and first selected range, $\pm r_1$, wherein the at least two first die comprise one die emitting at a wavelength shorter than the first selected wavelength, $\lambda_{s1}$, minus the first selected range, $r_1$, and one die emitting at a wavelength longer than the first selected wavelength, $\lambda_{s1}$, plus the first selected range, $r_1$, such that the average weighted wavelength, $<\lambda_{aww1}>$, of the at least two first die is within $\lambda_{s1} \pm r_1$.

2. The LED array of claim 1 wherein said first color string has an intensity of about $\Phi_{w1}$ lumens within a range of about ±5%.

3. The LED array of claim 1 wherein said first color string has an intensity of about $\Phi_{w1}$ lumens within a range of about ±10%.

4. The LED array of claim 1 wherein said first color string has an intensity of about $\Phi_{w1}$ lumens within a range of about ±15%.

5. The LED array of claim 1 wherein said first color string has an intensity of about $\Phi_{w1}$ lumens within a range of about ±20%.

6. The LED array of claim 1 wherein the first selected range, $r_1$, is about $\leq 1$ nm.

7. The LED array of claim 1 wherein the first selected range, $r_1$, is about $\leq 5.0$ nm.

8. The LED array of claim 1 wherein the first selected range, $r_1$, is about $\leq 7.5$ nm.

9. The LED array of claim 1 wherein the first selected range, $r_1$, is about $\leq 10$ nm.

10. The LED array of claim 1 further comprising a second color string comprising at least two second LED die emitting about a second selected wavelength, $\lambda_{s2}$, and second selected range, $\pm r_2$, wherein the at least two second die comprise one die emitting at a wavelength shorter than the second selected wavelength, $\lambda_{s2}$, minus the second selected range, $r_2$, and one die emitting at a wavelength longer than the second selected wavelength, $\lambda_{s2}$, plus the second selected range, $r_2$, such that the average weighted wavelength, $<\lambda_{aww2}>$, of the at least two second die is within $\lambda_{s2} \pm r_2$.

11. The LED array of claim 10 wherein the second selected range, $r_2$, is equal to or less than a value chosen from a group comprising 1, 2.5, 5, and 10 nm.

12. The LED array of claim 10 wherein said second color string has an intensity of about $\Phi_{w2}$ lumens within a range of about ±2.5% or within a range of about ±5% within a range of about ±10% or within a range of about ±20%.

13. The LED array of claim 1 wherein said first color string is chosen from a group comprising a red string, a green string, a blue string, an amber string and a white string.

14. A method for selecting die for a LED array comprising the steps:
selecting first wavelength, $\lambda_{s1}$ and first range, $r_1$; and
selecting at least two first LED die emitting about the first wavelength wherein the at least two die comprise one die emitting at a wavelength shorter than the first wavelength minus the first range, $[\lambda_{s1}-r_1]$, and one die emitting at a wavelength longer than the first wavelength plus the first range, $[\lambda_{s1}+r_1]$, such that the average weighted wavelength, $<\lambda_{aww1}>$ of the at least two first die satisfies: $[\lambda_{s1}-r_1] << \lambda_{aww1} > < [\lambda_{s1}+r_1]$.

15. The method of claim 14 further comprising the steps:
selecting a second wavelength, $\lambda_{s2}$, and a second range, $r_2$;
selecting at least two second LED die emitting about the second wavelength wherein the at least two second die comprise one die emitting at a wavelength less than the second wavelength, $\lambda_{s2}$, minus the second range, $r_2$, and one die emitting at a wavelength longer than the second wavelength, $\lambda_{s2}$, plus the second range, $r_2$, such that the average weighted wavelength, $\langle\lambda_{aww2}\rangle$ of the at least two second die satisfies: $[\lambda_{s2}-r_2]<<\lambda_{aww2}><[\lambda_{s2}+r_2]$.

16. The method of claim 14 further comprising the step of selecting all of said at least two first die such that said first color string emits about first nominal lumen specification, $\Phi_{w1}$, within a range of $\leq\pm 2.5\%$.

17. The method of claim 14 further comprising the step of selecting all of said at least two first die such that said first color string emits about first nominal lumen specification, $\Phi_{w1}$, within a range of $\leq\pm 10\%$.

18. The method of claim 14 further comprising the step of selecting all of said at least two first die such that said first color string emits about said first wavelength, $\lambda_{s1}$ and said first range, $r_1$, wherein said first wavelength is a wavelength between about 440 nm and 640 nm and said first range is a range between about 1 nm and 10 nm.

19. A LED array comprising;
first and second color strings;
first and second selected wavelengths, $\lambda_{s1}$, $\lambda_{s2}$; and
first and second selected wavelength ranges, $r_1$, $r_2$, such that first and second color strings each comprise at least two LED die emitting about first and second wavelengths, $\lambda_{s1}$, $\lambda_{s2}$, wherein the at least two die of the first color string comprise one die emitting at a wavelength shorter than the first selected wavelength, $\lambda_{s1}$, minus the first selected range, $r_1$, and one die emitting at a wavelength longer than the first selected wavelength, $\lambda_{s1}$, plus the first selected range, $r_1$, and wherein the at least two die of the second color string comprise one die emitting at a wavelength shorter than the second selected wavelength, $\lambda_{s2}$, minus the second selected range, $r_2$, and one die emitting at a wavelength longer than the second selected wavelength, $\lambda_{s2}$, plus the second selected range, $r_2$, such that the average weighted wavelengths of the first color string and the second color string satisfy the requirements: $[\lambda_{s1}-r_1]<<\lambda_{aww1}><[\lambda_{s1}+r_1]$ and $[\lambda_{s2}-r_2]<<\lambda_{aww2}><[\lambda_{s2}+r_2]$.

20. The LED array of claim 19 wherein said first color string emits about a first color string selected intensity, $\Phi_{w1}$ lumens within a range of $\leq\pm 2.5\%$ and said second color string emits about a second color string selected intensity, $\Phi_{w2}$ lumens $\leq\pm 2.5\%$.

21. The LED array of claim 11 wherein said first color string emits about a first color string selected intensity, $\Phi_{w1}$ lumens within a range of $\leq\pm 2.5\%$ and said second color string emits about a second color string selected intensity, $\Phi_{w2}$ lumens $\leq\pm 2.5\%$.

22. The LED array of claim 11 wherein $\lambda_{s1}$ and $\lambda_{s2}$ are between about 440 nm and 640 nm and said first and second ranges, $r_1$ and $r_2$, are less than or equal to about 10 nm.

23. The LED array of claim 19 wherein $\Phi_{w1}$ and $\Phi_{w2}$ are between about 20 lm and 10,000 lm.

24. A luminaire comprising an LED array comprising at least one color string comprising at least two LED die emitting about a first selected wavelength, $\lambda_{s1}$ within first selected range, $r_1$, wherein the at least two die of the at least one color string comprise one die emitting at a wavelength shorter than the first selected wavelength, $\lambda_{s1}$, minus the first selected range, $r_1$, and one die emitting at a wavelength longer than the first selected wavelength, $\lambda_{s1}$, plus the first selected range, $r_1$, such that the average weighted wavelength of the first color string satisfies the requirement: $[\lambda_{s1}-r_1]<<\lambda_{aww1}><[\lambda_{s1}+r_1]$.

25. The luminaire of claim 24 wherein said average weighted wavelength, $\langle\lambda_{aww1}\rangle$, is chosen between about 440 and 640 nm and said first selected range is chosen equal to or less than about 10 nm.

* * * * *